(12) United States Patent
Yang et al.

(10) Patent No.: US 9,184,213 B2
(45) Date of Patent: Nov. 10, 2015

(54) NANOSCALE SWITCHING DEVICE

(75) Inventors: Jianhua Yang, Palo Alto, CA (US);
Dmitri Strukov, Mountain View, CA (US); Wei Wu, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 580 days.

(21) Appl. No.: 12/696,524

(22) Filed: Jan. 29, 2010

(65) Prior Publication Data

US 2011/0186801 A1    Aug. 4, 2011

(51) Int. Cl.

| | |
|---|---|
| *H01L 27/105* | (2006.01) |
| *H01L 27/24* | (2006.01) |
| *H01L 27/118* | (2006.01) |
| *H01L 45/00* | (2006.01) |
| *G11C 13/00* | (2006.01) |
| *G11C 11/419* | (2006.01) |
| *H01L 27/115* | (2006.01) |
| *H01L 27/112* | (2006.01) |

(52) U.S. Cl.
CPC .............. *H01L 27/24* (2013.01); *G11C 11/419* (2013.01); *G11C 13/004* (2013.01); *G11C 13/0007* (2013.01); *G11C 13/0009* (2013.01); *G11C 13/0069* (2013.01); *H01L 27/115* (2013.01); *H01L 27/118* (2013.01); *H01L 27/11206* (2013.01); *H01L 27/2409* (2013.01); *H01L 45/00* (2013.01); *H01L 45/04* (2013.01); *H01L 45/085* (2013.01); *H01L 45/1233* (2013.01); *H01L 45/146* (2013.01)

(58) Field of Classification Search
CPC ........... G11C 13/0069; G11C 13/0007; G11C 13/004; G11C 2013/009; G11C 2213/51; G11C 2013/0073; G11C 2213/32; G11C 2213/52; G11C 11/419; G11C 13/0009; G11C 2213/71; G11C 2013/70; G11C 2013/005; H01L 27/115; H01L 27/118; H01L 45/04; H01L 27/24; H01L 45/1233; H01L 45/146; H01L 45/085; H01L 27/11206; H01L 27/2409

See application file for complete search history.

(56) References Cited

U.S. PATENT DOCUMENTS

| | | | | |
|---|---|---|---|---|
| 2002/0000577 | A1* | 1/2002 | Ema et al. | 257/202 |
| 2002/0163830 | A1* | 11/2002 | Bulovic et al. | 365/151 |
| 2002/0167039 | A1* | 11/2002 | Tsuboi et al. | 257/309 |
| 2006/0154432 | A1* | 7/2006 | Arai et al. | 438/385 |
| 2007/0195581 | A1* | 8/2007 | Morimoto | 365/148 |
| 2008/0129681 | A1* | 6/2008 | Hagood et al. | 345/109 |
| 2009/0129143 | A1* | 5/2009 | Guo et al. | 365/158 |
| 2010/0008123 | A1* | 1/2010 | Scheuerlein | 365/148 |
| 2010/0157658 | A1* | 6/2010 | Schloss et al. | 365/148 |
| 2010/0157710 | A1* | 6/2010 | Lambertson et al. | 365/218 |
| 2010/0328988 | A1* | 12/2010 | Nagashima et al. | 365/148 |
| 2012/0063197 | A1* | 3/2012 | Yang et al. | 365/148 |

FOREIGN PATENT DOCUMENTS

WO    WO 2009/050969    * 4/2009

* cited by examiner

*Primary Examiner* — Fei Fei Yeung Lopez
(74) *Attorney, Agent, or Firm* — Hewlett-Packard Patent Department

(57) ABSTRACT

A nanoscale switching device has an active region containing a switching material capable of carrying a species of dopants and transporting the dopants under an electrical field. The switching device has first, second and third electrodes with nanoscale widths. The active region is disposed between the first and second electrodes. A resistance modifier layer, which has a non-linear voltage-dependent resistance, is disposed between the second and third electrodes.

20 Claims, 5 Drawing Sheets

NANOSCALE SWITCHING DEVICE

BACKGROUND

Significant research and development efforts are currently directed towards designing and manufacturing nanoscale electronic devices, such as nanoscale memories. Nanoscale electronics promises significant advances, including significantly reduced features sizes and the potential for self-assembly and for other relatively inexpensive, non-photolithography-based fabrication methods. However, the design and manufacture of nanoscale electronic devices present many new challenges.

For instance, nanoscale devices using switching materials such as titanium oxide that show resistive switching behavior have recently been reported. The switching behavior of such devices has been linked to the memristor circuit element theory originally predicted in 1971 by L. O. Chua. The discovery of the memristive behavior in the nanoscale switches has generated significant interests, and there are substantial on-going research efforts to further develop such nanoscale switches and to implement them in various applications. One of the many important potential applications is to use such switching devices as memory units to store digital data. A memory device may be constructed as an array of such switching devices in a crossbar configuration to provide a very high device density. There are, however, technical challenges that have to be addressed, which include the needs to reduce the power required to write and read the switching devices and to control crosstalk among neighboring switching devices, while avoiding causing damages to the switching devices or any solutions incorporated for providing the current reduction and crosstalk control functionalities.

BRIEF DESCRIPTION OF THE DRAWINGS

Some embodiments of the invention are described, by way of example, with respect to the following figures.

DETAILED DESCRIPTION

Figure 1:
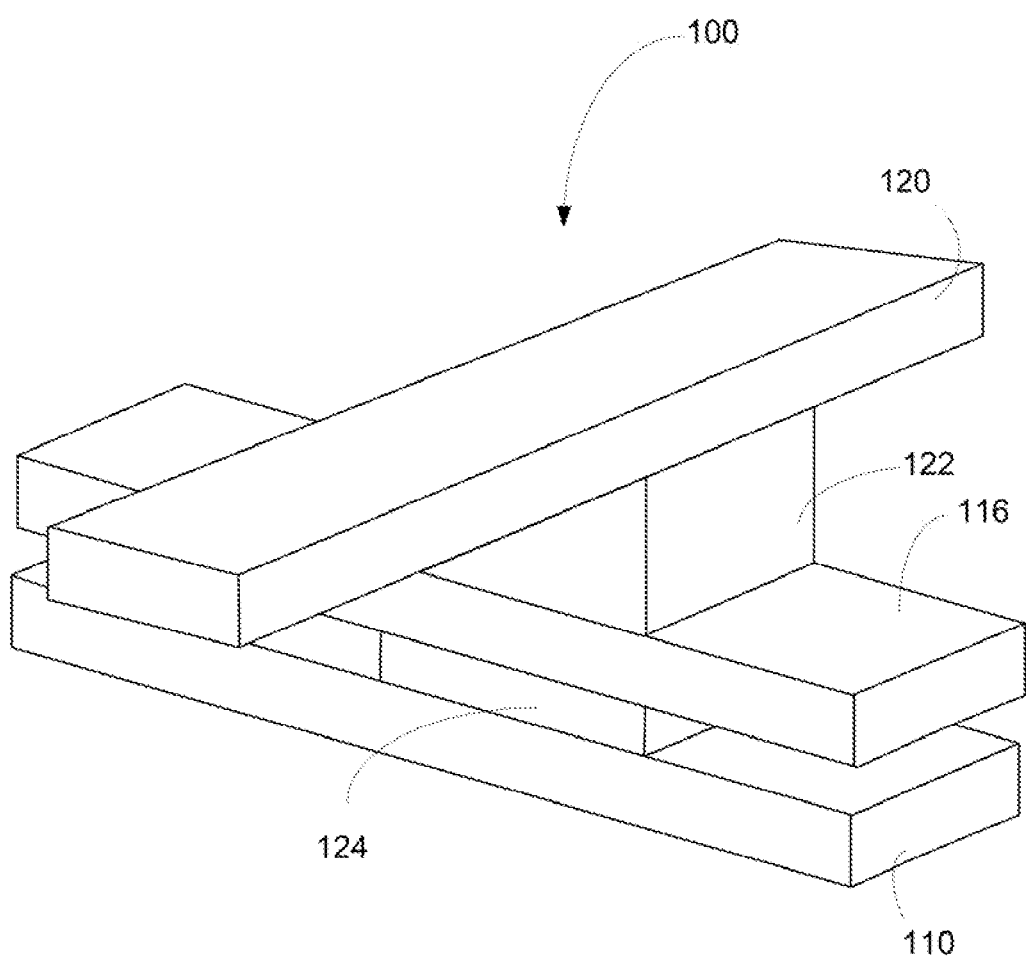
FIG. 1 is a schematic perspective view of a nanoscale switching device in accordance with an embodiment of the invention.

FIG. 1 shows a nanoscale switching device 100 in accordance with an embodiment of the invention. The switching device 100 comprises a bottom electrode 110, a middle electrode 116, and a top electrode 120 extending over the bottom electrode and the middle electrode. Disposed between the top and middle electrodes 120 and 116 is an active region 122 that contains a switching material. As described in greater detail below, the switching material has electrical characteristics that can be controllably modified to allow the device to be switched to ON and OFF states. Between the middle electrode 116 and the bottom electrode 110 is a resistance modifier layer 124 that has a voltage-dependent non-linear resistance such that the current flowing through it is a non-linear function of the voltage applied across the layer.

Each of the top, middle, and bottom electrodes 120, 116 and 110 may have a width and a thickness on the nanoscale. For example, the electrodes may have a width in the range of 10 nm to 500 nm, and a thickness in the range of 5 nm and 500 nm. Likewise, the active region 122 may have a height that is on the nanoscale and typically from a few nanometers to tens of nanometers. As used hereinafter, the term "nanoscale" means the object has one or more dimensions smaller than one micrometer, and in some embodiments less than 500 nanometers and often less than 100 nanometers. The electrodes 120, 116 and 110 are formed of a conductive material, which may be a metal such as platinum, gold, copper, tantalum, tungsten, etc., or doped semiconductor materials, or conductive metal oxides or nitrides. In the embodiment shown in FIG. 1, the middle electrode 116 extends generally parallel to the bottom electrode 110, and the top electrode 120 extends at an angle to the middle electrode. The angle may be, for example, around 90 degrees, but may be of other values depending on the device design.

During a write operation for switching the device 100 to an ON or OFF state, the top and middle electrodes 120 and 116 are used such that the switching voltage is applied only across the active region 122. In a read operation, the read voltage is applied to the top and bottom electrodes 120 and 110 such that the read current flows through the resistance modifier layer 124 and the active region 122. Due to the series connection of the resistance modifier layer 124 and the switching material in the active region 122 during the read operation, the total resistance seen by a voltage source is a sum of the resistance of the two layers. Thus, the resistance modifier layer contributes to the total resistance of the device 100 to give the latter a desired non-linear voltage dependence in a read operation. As described in greater detail below, in some embodiments, the resistance modifier layer 124 functions as a tunnel barrier, and in some other embodiments the resistance modifier layer functions as a diode. By using separate electrodes for the read and write operations, the device 100 can utilize the non-linear conduction of the tunnel barrier and/or the diode to reduce the current required for the read operation and/or to minimize crosstalk among adjacent switching devices, while avoiding the risk of breakdown of the tunnel barrier or diode caused by the relatively high voltage required to switch the device.

Figure 2:
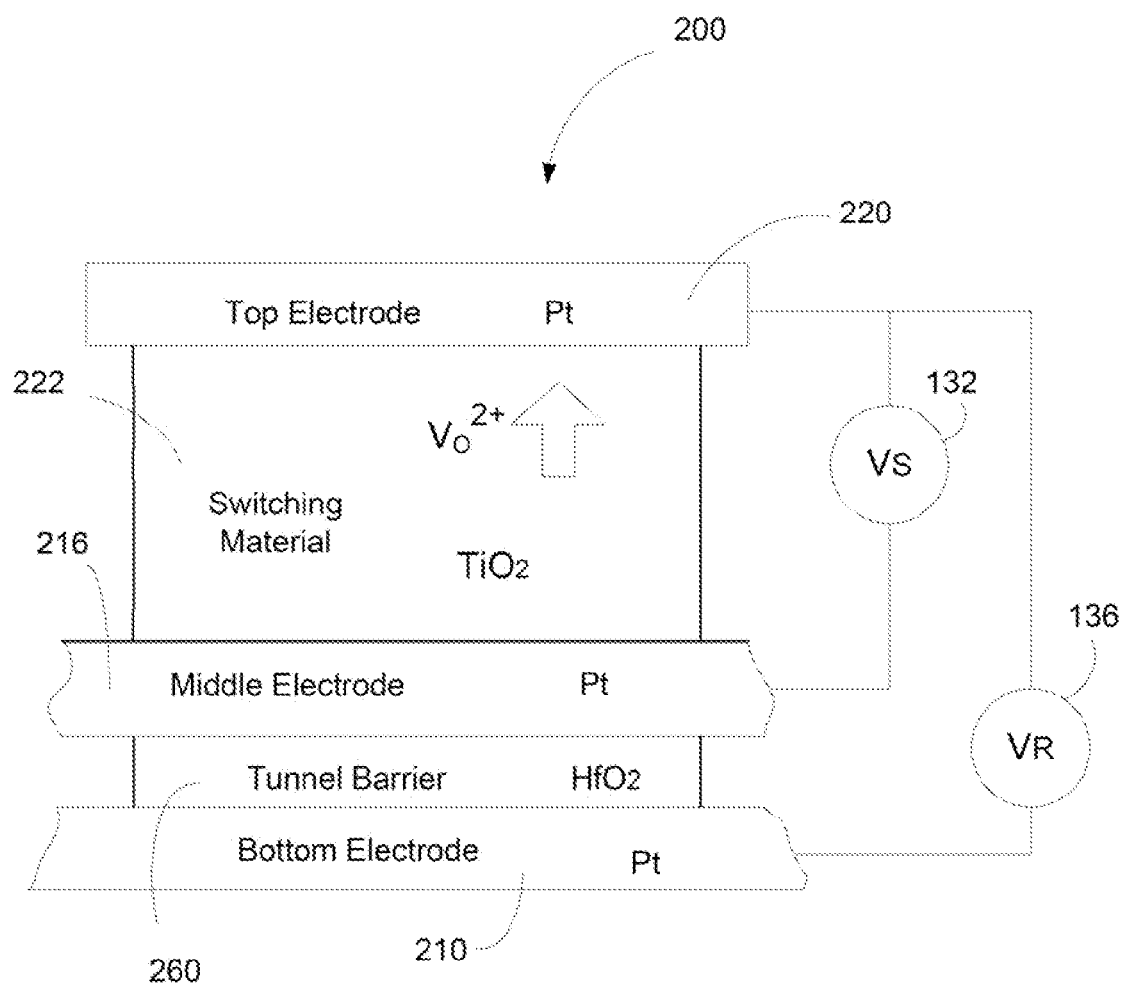
FIG. 2 is a schematic cross-sectional view of a nanoscale switching device in one embodiment of the invention with a tunnel barrier.

To facilitate a better understanding of the issues addressed by the invention, the components and operation principles of the switching device in one embodiment are described with reference to FIG. 2. As shown in FIG. 2, the active region 222 disposed between the top electrode 220 and middle electrode 216 contains a switching material. The switching material is capable of carrying a species of mobile ionic dopants such that the dopants can be controllably transported through the switching material and redistributed to change the electrical properties of either the switching material or the interface of the switching material and an electrode, which in the illustrated example of FIG. 2 may be the top electrode 220. This ability to change the electrical properties as a function of dopant distribution allows the switching device 200 to be placed in different switching states by applying a switching voltage 132 to the electrodes 220 and 216.

Generally, the switching material may be electronically semiconducting or nominally insulating and a weak ionic conductor. Many different materials with their respective suitable dopants can be used as the switching material. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. These listings of possible switching materials are not exhaustive and do not restrict the scope of the present invention.

The dopant species used to alter the electrical properties of the switching material depends on the particular type of switching material chosen, and may be cations, anions or vacancies, or impurities as electron donors or acceptors. For instance. In the case of transition metal oxides such as $TiO_2$, the dopant species may be oxygen vacancies ($V_O^{2+}$). For GaN, the dopant species may be nitride vacancies or sulfide ion dopants. For compound semiconductors, the dopants may be n-type or p-type impurities.

By way of example, as illustrated in FIG. 2, the switching material may be $TiO_2$, and the dopants may be oxygen vacancies ($V_O^{2+}$). When a DC switching voltage 132 from a voltage source is applied across the top and middle electrodes 220 and 216, an electrical field is created across the active region 222. This electric field, if of sufficient strength and proper polarity, may drive the oxygen vacancies to drift through the switching material in the active region 222 towards the top electrode 220, thereby turning the device into an ON state.

If the polarity of the electrical field is reversed, the oxygen vacancies may drift in an opposite direction across the active region 222 and away from the top electrode 220, thereby turning the device into an OFF state. In this way, the switching is reversible and may be repeated. Due to the relatively large electrical field needed to cause dopant drifting, after the switching voltage is removed, the locations of the dopants remain stable in the switching material. In other words, the switching may be non-volatile.

The state of the switching device 200 may be read by applying a read voltage 136 to the top and bottom electrodes 220 and 210 to sense the resistance across these two electrodes. The read voltage is typically much lower than the switching voltage required to cause drilling of the ionic dopants in the active region 222, so that the read operation does not alter the ON/OFF state of the switching device.

The switching behavior described above may be based on different mechanisms. In one mechanism, the switching behavior may be an "interface" phenomenon. For instance, in the illustrated example of FIG. 2, initially, with a low concentration of oxygen vacancies in the $TiO_2$ switching material near the top electrode 220, the interface of the switching material and the top electrode 220 may behave like a Schottky barrier, with an electronic barrier that is difficult for electrons to go through. Similarly, the interface of the switching material and the middle electrode 216 may also behave like a Schottky barrier, with a flow direction opposite to that of the Schottky-like barrier at the top electrode 220. As a result, the device has a relatively high resistance in either flow direction. When a switching voltage 132 is applied to the top and middle electrodes 220 and 216 to turn the device ON, with the top electrode as the negative side, the oxygen vacancies drift towards the top electrodes 220. The increased concentration of dopants near the top electrode 220 changes the electrical property of the interface from one like a Schottky harrier to one like an Ohmic contact, with a significantly reduced electronic barrier height or width. As a result, electrons can tunnel through the interface much more easily, and the switching device 200 is now in the ON state with a significantly reduced overall resistance for a current flowing from the middle electrode 216 to the top electrode 220.

In another mechanism, the reduction of the resistance of the active region 222 may be a "bulk" property of the switching material. The redistribution of the dopant level in the switching material causes the resistance across the switching material to fall, and this may account for the decrease of the resistance of the device between the top and middle electrodes 220 and 216. It is also possible that the resistance change is the result of a combination of both the bulk and interface mechanisms. Even though there may be different mechanisms for explaining the switching behavior, it should be noted that the present invention does not rely on or depend on any particular mechanism for validation, and the scope of the invention is not restricted by which switching mechanism is actually at work.

In general, due to the small dimensions of the nanoscale switching device, it is desirable to minimize the power required for the read operation by having a higher device resistance in both ON and OFF states. This may be achieved by adding a tunnel barrier in series with the switching layer. Moreover, when multiple switching devices are placed in an array such as a crossbar arrangement, crosstalk among adjacent switching devices may become a problem. One effective way to reduce the crosstalk is to place a diode in series with the switching layer in each device. One significant issue concerning the use of the tunnel barrier or diode, however, is that they can be easily broken down if exposed to a high voltage. In a switching device, the relatively high switching voltage needed to cause dopant drifting in the switching material could break down the tunnel barrier or diode during a switching operation, causing irreversible damages to the device. In accordance with a feature of embodiments of the invention, this breakdown problem may be effectively solved by using different electrodes for the read and write operations. In a read operation, a set of electrodes are used such that the tunnel barrier or diode is in series of the switching layer. In a write operation, a different set of electrodes are used such that only the switching layer is subject to the high switching voltage and current, thereby protecting the tunnel barrier or diode from the potentially destructive high voltage.

In the embodiment of FIG. 2, a tunnel barrier 260 is incorporated in the switching device 200. The switching material is placed between the top and middle electrodes 220 and 216, while the tunnel barrier 260 is disposed between the middle and bottom electrodes 216 and 210. To turn the device 200 ON or OFF, the top and middle electrodes 220 and 216 are connected to the switching voltage 132, and the switching current flows through the switching layer in the active region 222. Because the tunnel barrier 260 is outside the region between the top and middle electrodes, it is not subject to the switching voltage. During a read operation, the top and bottom electrodes 220 and 210 are selected for connection to the read voltage 136. As a result, the read voltage is applied to the switching material in the active region 222 and the tunnel hairier 260, and the read current flows though both of them. Thus, the overall resistance seen by the voltage source in this read operation includes contributions from both the tunnel barrier 260 and the switching material in the active region.

Generally, the tunnel barrier 260 presents an energy barrier for electrons to tunnel through. The tunneling probability depends on the electron energy, and the current passing through the tunnel barrier 160 has a non-linear dependence on the voltage across the barrier. A tunnel barrier is typically formed of a thin layer of insulator material, with the thickness on the order of nanometers. Suitable materials for forming the tunnel barrier 260 includes various types of oxides such as Al2O3, BaZrO3, CdO, HfO2, HfSiO$_x$, LaO3, MgO, Sc$_2$O$_3$, SiO$_2$, Ta$_2$O$_5$, TiO$_2$, Y$_2$O$_3$, ZrO$_2$, ZrSiO$_x$, and nitrides such as Si$_3$N$_4$AlN. A tunnel barrier typically has an onset of current flow at a threshold voltage and may be characterized with an OFF resistance $R_{OFF}$ below the threshold voltage and an ON resistance $R_{ON}$ above the threshold voltage, with $R_{ON}$ significantly smaller than $R_{OFF}$. For example, one test film of 1.5 nm HfO$_2$ tunnel barrier shows a $R_{ON}$ of 0.1 MOhm and a $R_{OFF}$ of 10 MOhm, and a threshold voltage around 1.2V.

For use in the switching device, the threshold voltage of the tunnel barrier in some embodiments may be selected to be between the read voltage $V_R$ and one half of $V_R$. With such a threshold voltage, the read voltage $V_R$ is sufficient for causing a read current to flow through the tunnel barrier and the switching material. At the same time, leakage currents that may go through multiple adjacent switching devices in an array may be substantially suppressed due to the low conductance of the tunnel barriers in the adjacent devices below the threshold voltage. Also, the ON resistance $R_{ON}$ of the tunnel barrier, even though significantly lower than $R_{OFF}$, is still substantial compared to the ON resistance of the switching layer. As the overall resistance of the switching device in the read operation is a combination of the resistance of the tunnel barrier and the switching layer, the tunnel barrier helps keep the device resistance high in a read operation to reduce the read current.

Figure 3:
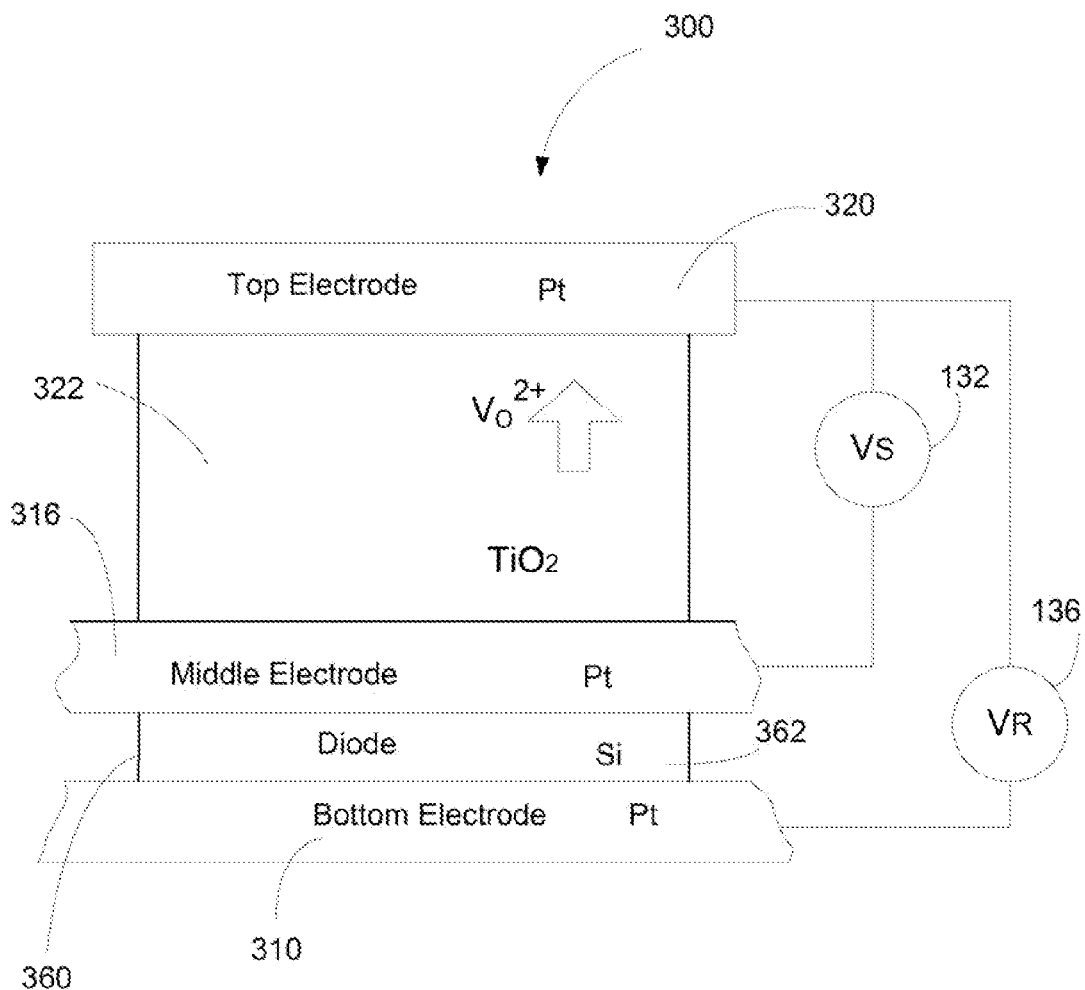
FIG. 3 is a schematic cross-sectional view of a nanoscale switching device in another embodiment of the invention with a diode.

FIG. 3 shows an embodiment of a switching device 300 that includes a diode 360. The diode 360 is disposed between a middle electrode 316 and the bottom electrode 310, while an active region 322 containing a switching material is disposed between the top electrode 320 and the middle electrode 316. In a write operation, the top and middle electrodes 320 and 316 are connected to the switching voltage 132. Because the diode 360 is outside the loop for the write operation, it is not at risk of being broken down by the relatively high switching voltage. In a read operation, the top and bottom electrodes 320 and 310 are connected to the read voltage 136. This connection places the diode 360 and the switching material in the active region 322 in series for the read operation.

The diode 360 may be formed in various ways. For example, the diode can be a Schottky diode, formed at the interface of a layer of a semiconductor material 362 and a selected metal that forms the bottom electrode 310. The semiconductor material may be Si, Ge, GaAs or oxides, such as ZnO, and the metal may be platinum, palladium, etc. The diode may also be a semiconductor diode, for example a Si p-n junction.

Figure 4:
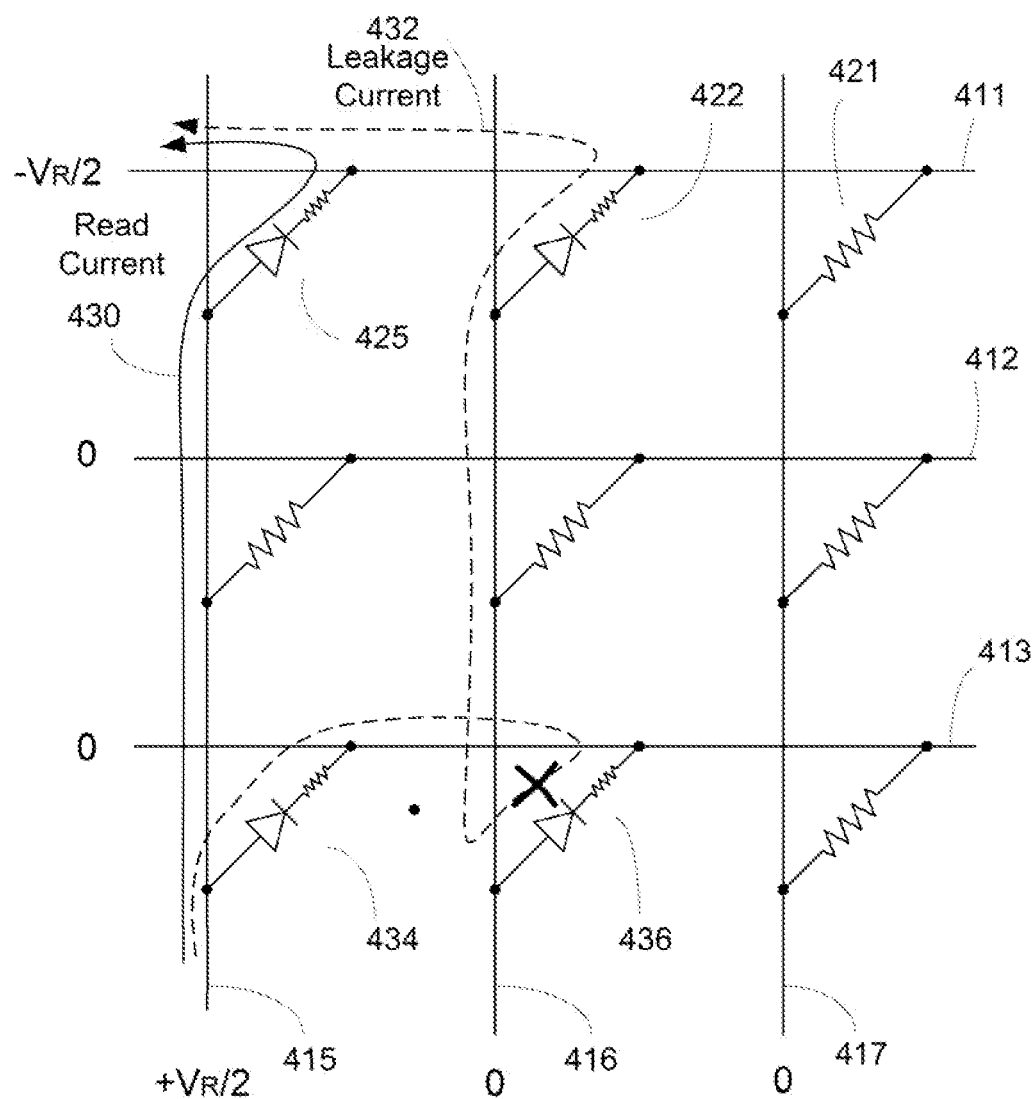
FIG. 4 is an electronic circuit diagram of an array of nanoscale switching devices of the embodiment of FIG. 3.

As mentioned above, placing the diode 360 in series with the switching layer of the switching device 300 may be an effective way to suppress crosstalk between the switching device and its neighboring switching devices in an array. This functionality is illustrated in FIG. 4, which shows an array of switching devices connected by row electrode lines 411-413 and column electrode lines 415-417. At each intersection of the row and column electrodes is a switching device, which is represented in electronic symbols. A switching device that is in its OFF state and thus has a large resistance, such as the device 421, is represented simply as a resistor. A switching device in its ON state. Such as the device 422, is represented as a diode in series with a small resistor that represents the resistance of the switching material.

To read the resistance of the device 425 connected by the row line 411 and the column line 415, a positive voltage of $V_R/2$ is applied to the column line 415 and a negative voltage of $-V_R/2$ is applied to the row line 411, such that a total read voltage of $V_R$ is applied across the switching device 425. The other row and column lines not involved in this read operation are left floating or grounded. The read current flows from the column line 415 through the device 425 to the row line 411 along the path 430 shown in FIG. 4. Nevertheless, there are other potential paths for a leakage current to go from the column line 415 to the row line 411. As illustrated, one potential path 432 is to go through the three devices 434, 436, and 422, which are all in the ON state and thus with a low resistance. This crosstalk or leakage path 432, however, is effectively blocked, because the direction of the current flow through the device 436 is opposite to the flow direction of the diode of that device. Without integrating a diode in each of the switching devices, such a crosstalk or leakage current path is not blocked. In a densely packed array of nanoscale switching devices, there may be many possible crosstalk current paths, and the potentially large and variable crosstalk currents can make the reading of a selected switching device very difficult.

Figure 5:
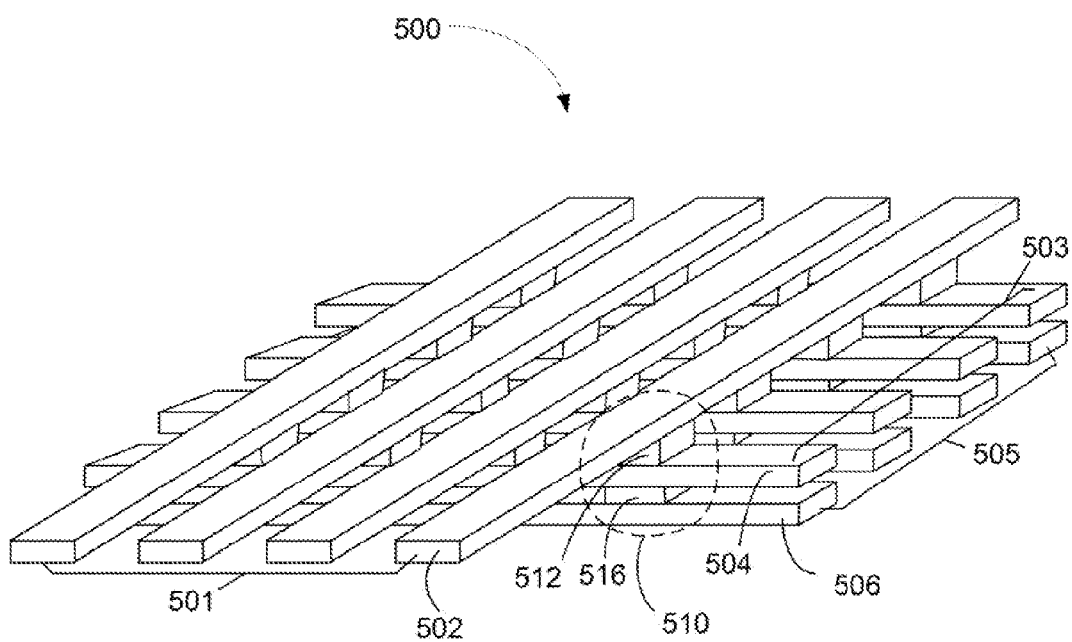
FIG. 5 is a schematic 3-D view of a crossbar array of nanoscale switching devices of the embodiment shown in FIG. 1.

The nanoscale switching devices with separate electrodes for read and write operations may be formed into a crossbar array for various applications. FIG. 5 shows an example of a two-dimensional array 500 of such switching devices. The array has a first group 501 of generally parallel nanowires 502 in a top layer, a second group 503 of generally parallel nanowires 504 in a middle layer, and a third group 505 of generally parallel nanowires 506 in a bottom layer. The first group 501 of nanowires run in a first direction, and the second and third groups 503 and 505 of nanowires are parallel to each other and run in a second direction at an angle, such as 90 degrees, from the first direction. The three layers of nanowires form a two-dimensional crossbar structure, with each nanowire 502 in the first layer intersecting a plurality of the nanowires 504 of the second layer and the nanowires 504 of the third layer. A three-terminal switching device 510 may be formed at each intersection of the nanowires in this crossbar structure. The switching device 510 has a nanowire 502 of the first group 501 as its top electrode, a nanowire 504 of the second group 503 as its middle electrode, and a nanowire 506 of the third group 505 as its bottom electrode. An active region 512 containing a switching material is disposed between the top and middle nanowires 502 and 504; and a resistance modifier layer 516 is disposed between the middle nanowire 504 and the bottom nanowire 506. In accordance with embodiments of the invention, the resistance modifier layer 516 may be in the form of a tunnel barrier or a diode for reducing the read current and/or suppressing crosstalk among the switching device 510 and its neighbors.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:
1. A nanoscale switching device comprising:
a first electrode of a nanoscale width;
a second electrode of a nanoscale width;
a third electrode of a nanoscale width, wherein the second electrode and the third electrode are arranged parallel with respect to each other
an active region disposed between the first and second electrodes, the active region containing a switching material capable of carrying a species of dopants and transporting the dopants under an electrical field;

a resistance modifier layer disposed between the second and third electrodes, the resistance modifier layer having a non-linear voltage-dependent resistance;

a write voltage source for applying a write voltage to change a state of said active region, said write voltage source being connected so as to apply said write voltage to and between said first and second electrodes, such that said write voltage is applied across said active region without being applied across said resistance modifier layer; and a read voltage source for applying a read voltage to ascertain a state of said active region, said read voltage source being connected so as to apply said read voltage between said first and third electrodes.

2. A nanoscale switching device as in claim 1, wherein the resistance modifier layer forms a tunnel barrier.

3. A nanoscale switching device as in claim 2, wherein the resistance modifier layer is formed of an oxide material.

4. A nanoscale switching device as in claim 1, wherein the resistance modifier layer forms a diode.

5. A nanoscale switching device as in claim 1, wherein the resistance modifier layer is formed of a semiconducting or insulating material.

6. A nanoscale switching device as in claim 1, wherein the switching material is a metal oxide.

7. A nanoscale switching device as in claim 6, wherein the switching material is titanium oxide.

8. A nanoscale switching device as in claim 1, wherein the second electrode extends generally parallel to the third electrode, and the first electrode extends at an angle to the second electrode.

9. A nanoscale crossbar array comprising:
a first group of conductive nanowires running in a first direction;
a second group of conductive nanowires running in a second direction and intersecting the first group of nanowires;
a third group of conductive nanowires disposed in parallel to the second group of nanowires;
a plurality of switching devices formed at intersections of the first group of nanowires with the second and third groups of nanowires, each switching device having a first electrode formed by a first nanowire of the first group, a second electrode formed by a second nanowire of the second group, and third electrode formed by a third nanowire of the third group, and an active region disposed at the intersection between the first and second electrodes and a resistance modifier layer disposed between the second and third electrodes, the active region comprising a switching material capable of carrying a species of dopants and transporting the dopants under an electric field, the resistance modifier layer having a non-linear voltage-dependent resistance;
a write voltage source for applying a write voltage to change a state of a selected active region, said write voltage source being connected so as to apply said write voltage to and between said first and second electrodes associated with the selected active region, such that said write voltage is applied only across said selected active region without being applied across a corresponding resistance modifier layer that is located in a same switching device with said selected active region; and
a read voltage source for applying a read voltage to ascertain a state of a selected active region, said read voltage source being connected to so as to apply said read voltage between said first and third electrodes associated the selected active region.

10. A nanoscale crossbar array as in claim 9, wherein the resistance modifier layer of each switching device forms a tunnel barrier.

11. A nanoscale crossbar array as in claim 10, wherein the resistance modifier layer is formed of an oxide material.

12. A nanoscale crossbar array as in claim 9, wherein the resistance modifier layer forms a diode.

13. A nanoscale crossbar array as in claim 9, wherein the resistance modifier layer is formed of a semiconducting or insulating material.

14. A nanoscale crossbar array as in claim 9, wherein the switching material is a metal oxide.

15. A nanoscale crossbar array as in claim 9, wherein the switching material is titanium oxide.

16. A nanoscale switching device as in claim 1, wherein a threshold voltage of said resistance modifier layer is between said read voltage and one half of said read voltage.

17. A nanoscale switching device as in claim 1, wherein said reading voltage source applies a positive voltage to one of said first and third electrodes and a negative voltage to the other of said first and third electrodes such that said positive voltage and said negative voltage sum to said read voltage.

18. A nanoscale crossbar array as in claim 9, wherein a threshold voltage of said resistance modifier layer is between said read voltage and one half of said read voltage.

19. A nanoscale crossbar array as in claim 9, wherein said reading voltage source applies a positive voltage to one of said first and third electrodes and a negative voltage to the other of said first and third electrodes such that said positive voltage and said negative voltage sum to said read voltage.

20. A method of operating a switching device, wherein said switching device comprise:
a first electrode;
a second electrode;
a third electrode, wherein the second electrode and the third electrode are arranged parallel with respect to each other
an active region disposed between the first and second electrodes, the active region containing a switching material capable of carrying a species of dopants and transporting the dopants under an electrical field; and
a resistance modifier layer disposed between the second and third electrodes, the resistance modifier layer having a non-linear voltage-dependent resistance;
the method comprising:
selectively changing a state of said active region by applying a write voltage to and between said first and second electrodes, such that said write voltage is applied across said active region without being applied across said resistance modifier layer; and
selectively reading a state of said active region by applying a read voltage between said first and third electrodes.

* * * * *